United States Patent [19]

Nishikawa et al.

[11] Patent Number: 5,037,521
[45] Date of Patent: Aug. 6, 1991

[54] SPUTTERING APPARATUS

[75] Inventors: Yukio Nishikawa, Ikeda; Kunio Tanaka, Toyonaka; Yoshikazu Yoshida, Izumi, all of Japan

[73] Assignee: Matsushita Electric Ind., Ltd., Kadama, Japan

[21] Appl. No.: 504,548

[22] Filed: Apr. 4, 1990

[30] Foreign Application Priority Data

Apr. 13, 1989 [JP] Japan .................................. 1-93530

[51] Int. Cl.⁵ .............................................. C23C 14/34
[52] U.S. Cl. ........................... 204/298.02; 204/192.12
[58] Field of Search ........... 204/192.1, 192.11, 192.12, 204/298.01, 298.02, 298.04; 427/53.1

[56] References Cited

U.S. PATENT DOCUMENTS

| | | | |
|---|---|---|---|
| 4,664,769 | 5/1987 | Cuomo et al. | 204/192.11 X |
| 4,664,940 | 5/1987 | Bensoussan et al. | 427/53.1 |
| 4,814,259 | 3/1989 | Newman et al. | 427/53.1 X |
| 4,873,413 | 10/1989 | Vesugi et al. | 427/53.1 X |
| 4,892,751 | 1/1990 | Miyake et al. | 427/53.1 X |

Primary Examiner—Nam X. Nguyen
Attorney, Agent, or Firm—Ratner & Prestia

[57] ABSTRACT

A sputtering apparatus for producing a thin film with use of a laser beam is disclosed. The sputtering apparatus comprises a vacuum chamber, a target and a substrate disposed inside the vacuum chamber, a laser beam-projecting unit, a beam-shape adjusting unit, an optical scanning unit, and a light-converging unit. The optical scanning unit comprises a mirror which rotates to allow the laser beam to scan the target, and the angular speed thereof is regulated so as to move the spot of the laser beam at a fixed speed on the target. The beam-shape adjusting unit or the light-converging unit moves along its optical axis in synchronization with the movement of the mirror of the optical scanning unit, thereby keeping the spot of the laser beam at a predetermined size.

5 Claims, 2 Drawing Sheets

SPUTTERING APPARATUS

BACKGROUND OF THE INVENTION

1. Field of the Invention

This invention relates to a sputtering apparatus which produces thin films for thin film devices or the like with use of a laser beam.

2. Description of the Prior Art

FIG. 3 shows a conventional sputtering apparatus utilizing a laser beam, the construction of which is as described by S. Komura et al. in "Japanese Journal of Applied Physics" (p. 23, vol. 27 (1988)). The sputtering apparatus comprises a vacuum chamber 14 in which a target 15 and a substrate stage 16 are disposed facing each other. A substrate 17 is placed on the substrate stage 16. A laser beam 18, which is the second-order harmonic (which is visible light with a wavelength of 532 nm) of the laser beam emitted from a Q-switch YAG laser, is converged by an optical system 19 and directed through a vacuum sealing window 20 provided on the vacuum chamber 14, and then projected onto the target 15. Upon receiving the laser beam 18, the material of the target 15 is sputtered out of the surface thereof and then deposited on the substrate 17 to form a thin layer thereon.

In a sputtering apparatus with the above configuration, however, since the intensity of the laser light varies from one portion to another on the surface of the target 15, the thickness of the resultant thin layer becomes uneven. Moreover, in the case where the film-forming process is repeated over and over for a long time, the portion of the target 15 onto which the laser beam with a greater intensity is always projected tends to be sputtered away from the surface thereof to a greater degree, as compared with the other portion, resulting in a recess with a substantial depth on the target 15. When the laser beam is diagonally directed onto the target 15 with such a recess, the material in the recess cannot receive a sufficient amount of laser light, which further causes unevenness in the resultant thin film.

In order to form a thin film with a uniform thickness, many conventional sputtering apparatuses adopt the arrangement in which the substrate is moved so as to receive the sputtered material with a uniform thickness thereon. This requires a complicated mechanism, and still cannot solve the above-mentioned problem of the deformation of the surface of the target caused by the repeated film-forming processes.

SUMMARY OF THE INVENTION

The sputtering apparatus of the present invention, which overcomes the above-discussed and numerous other disadvantages and deficiencies of the prior art, comprises a vacuum chamber; a target and a substrate which are disposed inside said vacuum chamber; a laser beam-projecting unit for emitting a laser beam; a beam-shape adjusting unit for adjusting the shape of said laser beam; an optical scanning unit for changing the direction of said laser beam so as to allow the laser beam to scan said target; and a light-converging unit for converging said laser beam coming from said optical scanning unit to direct the laser beam onto said target through a vacuum sealing window provided on said vacuum chamber.

In a preferred embodiment, the optical scanning unit comprises a mirror which reflects said laser beam toward said target while rotating to change the reflection angle thereof, the angular speed of said mirror being so regulated as to move the spot of the laser beam at a fixed speed on said target.

In a preferred embodiment, the beam-shape adjusting unit comprises a convex collimating lens and a concave collimating lens aligned to transmit said laser beam therethrough, the distance therebetween being changed along their optical axis in synchronization with the movement of said mirror of said optical scanning unit, so as to keep said spot of the laser beam at a predetermined size.

In a preferred embodiment, the light-converging unit is moved along its optical axis in synchronization with the movement of said mirror of said optical scanning unit, so as to keep said spot of the laser beam at a predetermined size.

In a preferred embodiment, the mirror of said optical scanning unit is a galvano-mirror.

In a preferred embodiment, the mirror of said optical scanning unit is a polygonal mirror.

Thus, the invention described herein makes possible the objective of providing a sputtering apparatus with a simple mechanism in which a target is scanned with a laser beam in such a manner that the spot thereof has a fixed size and moves at a fixed speed on the target, preventing the deformation of the surface of the target, thereby assuring the formation of a thin film with a uniform thickness.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
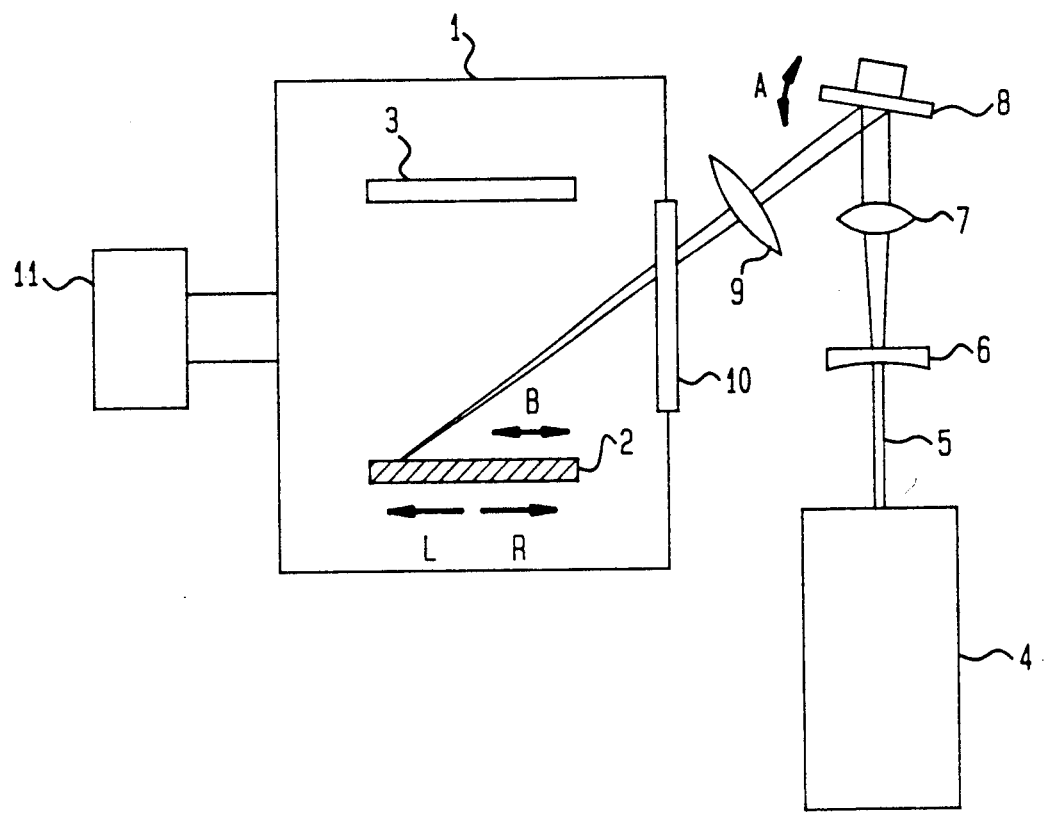
FIG. 1 is a schematic diagram showing a sputtering apparatus of the invention.

FIG. 1 shows a sputtering apparatus of this invention, which comprises a vacuum chamber 1, a target 2, a substrate 3, a laser beam-projecting unit 4 which emits a laser beam 5, a concave collimating lens 6, a convex collimating lens 7, a galvano-mirror 8, a light-converging lens 9, a vacuum sealing window 10, and a vacuum pump 11. In the vacuum chamber 1, the target 2 and the substrate 3 are located parallel to each other. The laser beam 5 emitted from the laser beam-projecting unit 4 passes through the concave collimating lens 6 and the convex collimating lens 7, which constitute a beam-shape adjusting unit. While passing through those collimating lenses 6 and 7, the laser beam 5 is enlarged in diameter. The laser beam 5 with the enlarged diameter is directed onto the galvano-mirror 8 which rotates, for example, upward and downward as indicated by the bi-directional arrow A. Then, the laser beam is reflected by the galvano-mirror 8 at a changing reflection angle in accordance with the movement of the galvano-mirror 8, and is directed through the light-converging lens 9 and the vacuum sealing window 10, so as to be projected onto the target 2, allowing the laser beam to scan the target 2 as indicated by the bi-directional arrow B.

If the galvano-mirror 8 rotates at a fixed angular speed, the spot of the laser beam moves at a changing speed on the target 2. As the distance between the spot on the target 2 and the light-converging lens 9 becomes longer, the spot moves faster, and conversely, as the distance becomes shorter, the spot moves slower. That is, the spot moves at an increasing speed in the direction of arrow L, and moves at a decreasing speed in the direction of arrow R. In this example, therefore, the angular speed at which the galvano-mirror 8 rotates is gradually made lower while the spot is moving in the direction of arrow L and is gradually made higher while the spot is moving in the direction of arrow R.

On the other hand, the location of the concave collimating lens 6 and the convex collimating lens 7 with respect to the position of the galvano-mirror 8 determines the size of the laser spot on the target 2. If the location of the collimating lenses 6 and 7 is fixed, the spot varies in size while it is moving on the target 2. In order to keep the spot at a predetermined size, the distance between the concave collimating lens 6 and the convex collimating lens 7 is gradually made longer while the spot is moving in the direction of arrow R, and the distance is gradually made shorter while the spot is moving in the direction of arrow L. In this way, the spot can be kept in a predetermined size by the movement of the collimating lenses 6 and 7 along their optical axis in synchronization with the movement of the galvano-mirror 8.

Figure 2:
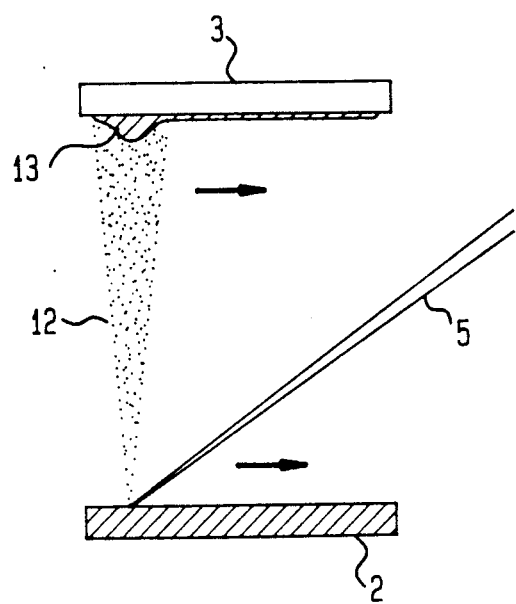
FIG. 2 is a schematic diagram showing a film-forming process in the sputtering apparatus of FIG. 1.
Figure 3:
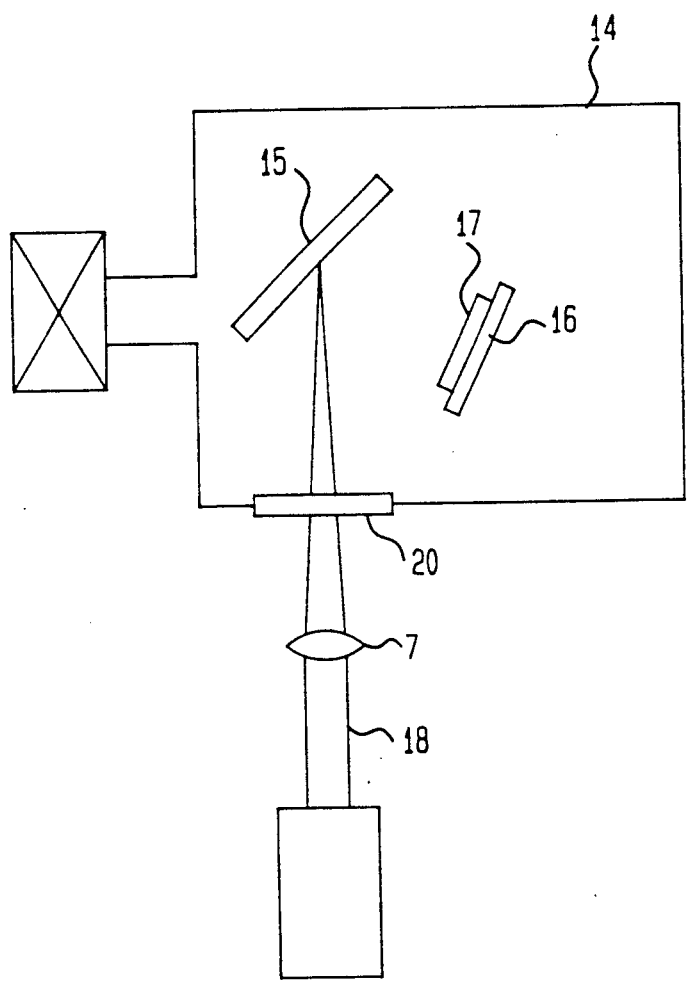
FIG. 3 is a schematic diagram showing a conventional sputtering apparatus.

FIG. 2 shows the process of forming a thin film on the substrate 3. When the laser beam 5 is projected onto the target 2, the material of the target 2 receives the energy of the laser beam 5 to be evaporated from the surface of the target 2, resulting in particles 12, which are then deposited on the substrate 3, thereby forming a thin film 13. The thin film 13 is formed on the portion of the substrate 3 corresponding to the portion of the target 2 which has received the laser beam 5, so that the thickness of the thin film 13 is not uniform over the entire surface of the substrate 3 in the early stage of the process. But since the spot of the laser beam 5 has a fixed size and moves at a fixed speed on the target 2 as described above, the entire surface of the target 2 is uniformly irradiated with the laser beam in the end. Accordingly, the material of the target 2 is uniformly evaporated from the whole surface thereof so that the particles 12 are uniformly deposited to cover a large area on the surface of the substrate 3, resulting in a large thin film with a uniform thickness.

Furthermore, because the material of the target 2 is uniformly sputtered out of the entire surface thereof as described above, the surface of the target is prevented from being deformed and can be kept flat. Thus, the entire surface of the target 2 can readily receive the laser beam 5 although the laser beam 5 is diagonally directed thereto as in this embodiment. Even if the film-forming process is repeated over and over for a long period of time, the surface of the target 2 can be kept flat, thereby further assuring the uniform thickness of every resultant thin film.

In the above embodiment, the spot of the laser beam is fixed in a predetermined size by the use of the collimating lenses 6 and 7, but it can also be adjusted by the movement of the light-converging lens 9 along its optical axis. In this case also, the light-converging lens 9 is moved in synchronization with the movement of the galvano-mirror 8.

The galvano-mirror is used as an optical scanning unit in the above-described embodiment, but other optical scanning units such as a polygonal mirror and the like can of course be employed.

As described above, in the sputtering apparatus of this invention, the target is scanned with the laser beam, with its spot having a fixed size and moving at a fixed speed on the target. This allows the material of the target to be uniformly sputtered out of the entire surface of the target, resulting in a thin film with a uniform thickness on the substrate. Since the material of the target is uniformly evaporated from the entire surface thereof, the surface of the target is prevented from being deformed even if the film-forming process is repeated many times. Thus, a thin film with a uniform thickness can be obtained in every film-forming process.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A sputtering apparatus comprising:
   a vacuum chamber;
   a target and a substrate which are disposed inside said vacuum chamber;
   a laser beam-projecting unit for emitting a laser beam;
   a beam-shape adjusting unit for adjusting the shape of said laser beam so as to keep the spot of the laser beam at a predetermined size;
   an optical scanning unit for changing the direction of said laser beam so as to allow the laser beam to scan said target so regulated as to move the spot of the laser beam at a fixed speed on said target; and
   a light-converging unit for converging said laser beam coming from said optical scanning unit to direct the laser beam onto said target through a vacuum sealing window provided on said vacuum chamber, wherein said light-converging unit is moved along its optical axis in synchronization with the movement of said optical scanning unit, so as to keep said spot of the laser beam at a predetermined size.

2. An apparatus according to claim 1, wherein said optical scanning unit comprises a mirror which reflects said laser beam toward said target while rotating to change the reflection angle thereof, the angular speed of said mirror being so regulated as to move the spot of the laser beam at a fixed speed on said target.

3. An apparatus according to claim 2, wherein said beam-shape adjusting unit comprises a convex collimating lens and a concave collimating lens aligned to transmit said laser beam therethrough, the distance therebetween being changed along their optical axis in synchronization with the movement of said mirror of said optical scanning unit, so as to keep said spot of the laser beam at a predetermined size.

4. An apparatus according to claim 2, wherein said mirror of said optical scanning unit is a galvano-mirror.

5. An apparatus according to claim 2,. wherein said mirror of said optical scanning unit is a polygonal mirror.

* * * * *

UNITED STATES PATENT AND TRADEMARK OFFICE
CERTIFICATE OF CORRECTION

PATENT NO. : 5,037,521

DATED : August 6, 1991

INVENTOR(S) : NISHIKAWA ET AL

It is certified that error appears in the above-identified patent and that said Letters Patent is hereby corrected as shown below:

Title page, Item [73] Assignee: delete "Matsushita Electric Ind., Ltd," and insert -- Matsushita Electric Industrial Co., Ltd.--

Signed and Sealed this

Twenty-ninth Day of December, 1992

Attest:

DOUGLAS B. COMER

Attesting Officer

Acting Commissioner of Patents and Trademarks